(12) United States Patent
Matsufuji et al.

(10) Patent No.: US 7,796,460 B2
(45) Date of Patent: Sep. 14, 2010

(54) NONVOLATILE SEMICONDUCTOR MEMORY DEVICE

(75) Inventors: Kensuke Matsufuji, Kawasaki (JP); Toshimasa Namekawa, Tokyo (JP); Hiroshi Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 158 days.

(21) Appl. No.: 12/140,071

(22) Filed: Jun. 16, 2008

(65) Prior Publication Data

US 2008/0316852 A1 Dec. 25, 2008

(30) Foreign Application Priority Data

Jun. 21, 2007 (JP) ............... 2007-164247

(51) Int. Cl.
*G11C 8/00* (2006.01)
(52) U.S. Cl. ............... 365/230.06; 365/97; 365/185.26
(58) Field of Classification Search ............ 365/230.06, 365/97, 185.26, 185.27, 185.14, 185.13, 365/174, 180, 182
See application file for complete search history.

(56) References Cited

U.S. PATENT DOCUMENTS

| 2006/0073642 | A1* | 4/2006 | Yeh et al. ............... 438/132 |
| 2006/0292754 | A1* | 12/2006 | Min et al. ............... 438/131 |
| 2008/0002504 | A1 | 1/2008 | Nakano et al. |
| 2008/0049485 | A1 | 2/2008 | Matsufuji et al. |
| 2008/0080295 | A1 | 4/2008 | Namekawa et al. |
| 2008/0316852 | A1 | 12/2008 | Matsufuji et al. |

FOREIGN PATENT DOCUMENTS

| JP | 5-226599 | 9/1993 |
| JP | 2001-102456 | 4/2001 |
| JP | 2004-111957 | 4/2004 |
| JP | 2008-526007 | 7/2008 |
| JP | 2008-192883 | 8/2008 |
| WO | WO 2006/069982 A1 | 7/2006 |

OTHER PUBLICATIONS

U.S. Appl. No. 11/971,425, filed Jan. 9, 2008, Kensuke Matsufuji et al.
U.S. Appl. No. 11/968,893, filed Jan. 3, 2008, Toshimasa Namekawa.
U.S. Appl. No. 12/553,616, filed Sep. 3, 2009, Namekawa.
U.S. Appl. No. 12/690,623, filed Jan. 20, 2010, Matsufuji et al.

* cited by examiner

*Primary Examiner*—Dang T Nguyen
(74) *Attorney, Agent, or Firm*—Oblon, Spivak, McClelland, Maier & Neustadt, L.L.P.

(57) ABSTRACT

A nonvolatile semiconductor memory device comprises an array of memory cells each including an antifuse to store information based on a variation in resistance in accordance with destruction of the insulator in the antifuse. The antifuse includes a semiconductor substrate, a first conduction layer formed in the surface of the semiconductor substrate, a first electrode provided on the first conduction layer to be given a first voltage, a second conduction layer provided on the semiconductor substrate with the insulator interposed therebetween, and a second electrode provided on the second conduction layer to be given a second voltage different from the first voltage. The first electrode or the second electrode is formed of a metal silicide.

9 Claims, 3 Drawing Sheets

NONVOLATILE SEMICONDUCTOR MEMORY DEVICE

CROSS-REFERENCE TO RELATED APPLICATION

This application is based upon and claims the benefit of priority from the prior Japanese Patent Application No. 2007-164247, filed on Jun. 21, 2007, the entire contents of which are incorporated herein by reference.

BACKGROUND OF THE INVENTION

1. Field of the Invention

The present invention relates to a nonvolatile semiconductor memory device comprising an array of memory cells each including an antifuse to store information based on a variation in resistance in accordance with destruction of the insulator in the antifuse.

2. Description of the Related Art

A semiconductor integrated circuit essentially requires a nonvolatile OTP (One Time Programmable) memory capable of continuously retaining stored information even after power-off. The uses thereof widely spread over the redundancy use in mass storage memories such as DRAMs and SRAMs, the use for tuning analog circuits, the use for storage of codes such as encryption keys, and the use for storing manufacture histories.

Previously, the memory redundancy has employed a ROM that includes a laser fuse. Such the laser fuse ROM, however, requires a special fuse blower and a blowing step using the blower and accordingly has a drawback associated with a high programming cost. The minimum dimension of the laser fuse is determined from the wavelength of the laser light used. Therefore, fine patterning can not be synchronized with other circuit parts, and the proportion of the occupied area gradually increases as a problem. Further, as programming is executed using a laser, programming can be executed only in a wafer state. Accordingly, it can not be used to relieve a failure found in a product test after packaging as a drawback. Therefore, there have been higher expectations to nonvolatile semiconductor memory devices electrically programmable without the use of any laser blower.

The electrically programmable nonvolatile semiconductor memory devices include a MOS-structured antifuse (see, for example, JP 5-226599A). In writing, a high voltage is applied across the antifuse to destruct an insulator to store one-bit information. In reading, a low voltage incapable of causing destruction of the insulator is applied across the antifuse to sense the presence/absence of destruction of the antifuse from the value of current flowing in the antifuse, thereby reading out one-bit information. In this way, the antifuse, because writing and reading can be simply executed with the application of a voltage across the antifuse, is one of nonvolatile semiconductor memory devices most expectedly available in the future.

In general, the insulator before destruction has an extremely large resistance of around 100 MΩ. The destructed insulator also has a large resistance of around 100 KΩ to 1 MΩ, however, and accordingly the application of a voltage of, for example, around 1 V on reading merely causes a small current of 1-10 μA flowing in the antifuse. This makes it difficult to sense the presence/absence of destruction of the antifuse in a short time, that is, to read information at a high speed. A solution needs an antifuse that allows a sufficiently large read current to flow therein.

SUMMARY OF THE INVENTION

In an aspect the present invention provides a nonvolatile semiconductor memory device comprising an array of memory cells each including an antifuse to store information based on a variation in resistance in accordance with destruction of the insulator in the antifuse, the antifuse including a semiconductor substrate, a first conduction layer formed in the surface of the semiconductor substrate, a first electrode provided on the first conduction layer to be given a first voltage, a second conduction layer provided on the semiconductor substrate with the insulator interposed therebetween, and a second electrode provided on the second conduction layer to be given a second voltage different from the first voltage, wherein the first electrode or the second electrode is formed of a metal silicide.

DETAILED DESCRIPTION OF THE EMBODIMENTS

The embodiments associated with the nonvolatile semiconductor memory device of the present invention will now be described with reference to the drawings.

First Embodiment

Figure 1:
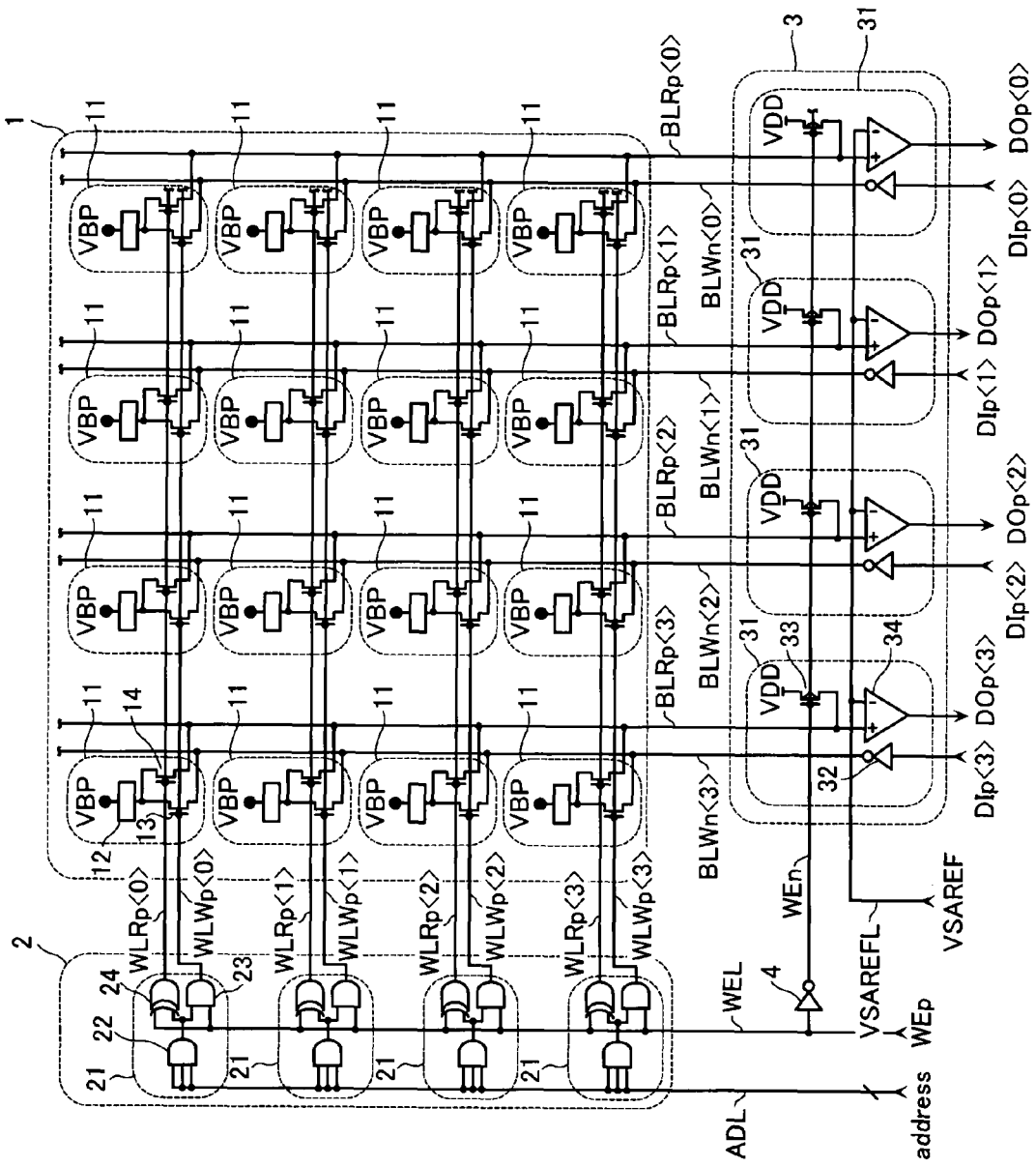
FIG. 1 is a brief block diagram of a nonvolatile semiconductor memory device according to a first embodiment of the present invention.

FIG. 1 shows a brief diagram of a nonvolatile semiconductor memory device according to a first embodiment of the present invention. As shown in FIG. 1, the nonvolatile semiconductor memory device according to the first embodiment mainly comprises a memory cell array 1 arranged in grid, a row decoder 2, and a data I/O block 3.

The memory cell array 1 includes a plurality of memory cells 11 arranged in grid. FIG. 1 exemplifies the memory cell array 1 of 4×4=16 bits though the present invention is not limited to this, needless to say.

Memory cells 11 forming a row are connected to respective pairs of write word lines WLWp<0>-WLWp<3> and read word lines WLRp<0>-WLRp<3>. Similarly, memory cells 11 forming a column are connected to respective pairs of write bit lines BLWn<0>-BLWn<3> and read bit lines BLRp<0>-BLRp<3>. The subscript "p" or "n" attached to the above-described signal line name indicates that the logic of the signal line is "positive logic" or "negative logic".

The memory cell 11 includes an antifuse 12, an N-type write gate transistor 13, and an N-type read gate transistor 14. The antifuse 12 has one end connected to a memory cell power supply VBP and the other end connected to a drain terminal of the N-type write gate transistor 13 and a drain terminal of the N-type read gate transistor 14. The N-type write gate transistor 13 has a gate terminal connected to the write word lines WLWp<0>-WLWp<3> and a source terminal connected to the write bit lines BLWn<0>-BLWn<3>. The N-type read gate transistor 14 has a gate terminal connected to the read word lines WLRp<0>-WLRp<3> and a source terminal connected to the read bit lines BLRp<0>-BLRp<3>.

The row decoder 2 includes a plurality of word line drivers 21. The word line drivers 21 are connected to a row address signal line ADL. The word line drivers 21 receive a row address signal "address" via the row address signal line ADL and selectively drive any one of the write word lines WLWp<0>-WLWp<3> and the read word lines WLRp<0>-WLRp<3>. Each word line driver 21 includes a row selection logic circuit 22 operative to receive the input of the row address signal "address"; a write word line driver 23 operative to receive the output from the row selection logic circuit 22; and a first read word line driver 24 operative to receive the output from the row selection logic circuit 22. The row selection logic circuit 22 and the write word line driver 23 comprise respective AND circuits, and the first read word line driver 24 comprises an XOR circuit.

The write word line drivers 23 are connected to a writing control signal line WEL. Each write word line driver 23 operates based on the result of AND of a writing control signal WEp on the writing control signal line WEL and the output signal from the row selection logic circuit 22. It drives the write word lines WLWp<0>-WLWp<3> up to the potential of a power supply VDD, for example, 3 V if the result is equal to "1". The write word line driver 23 also drives the write word lines WLWp<0>-WLWp<3> down to the ground potential 0 V if the result of AND is equal to "0".

The first read word line driver 24 similarly operates based on the result of XOR of the writing control signal WEp and the output signal from the row selection logic circuit 22. It drives the read word lines WLRp<0>-WLRp<3> up to the potential of the power supply VDD, for example, 3 V if the result is equal to "1". The first read word line driver 24 drives the read word lines WLRp<0>-WLRp<3> down to the ground potential 0 V if the result of XOR is equal to "0".

The data I/O block 3 includes a plurality of data I/O buffers 31. The data I/O buffers 31 receive the input of write signals DIp<0>-DIp<3> given from outside of the memory device and drive the write bit lines BLWn<0>-BLWn<3>. The data I/O buffers 31 also amplify read signals on the read bit lines BLRp<0>-BLRp<3> and provide read signals DOp<0>-DOp<3> to outside of the memory device. The data I/O buffers 31 having such the functions each include a first write bit line driver 32, a write disturbance protection circuit 33 operative to prevent failed write, and a read sense amp 34.

The first write bit line drivers 32 receive the input of write signals DIp<0>-DIp<3> given from outside of the memory device and drive the write bit lines BLWn<0>-BLWn<3>. The first write bit line driver 32 serves as an inverter. The write bit lines BLWn<0>-BLWn<3> are driven to 0 V same as the low-potential power supply at the time of writing and to the same potential as the power supply VDD, for example, 3 V in other cases.

The write disturbance protection circuit 33 comprises a P-type MOS transistor, which has a source terminal connected to the power supply VDD, a drain terminal connected to the read bit lines BLRp<0>-BLRp<3>, and a gate terminal connected to the write control signal line WEL for use in delivering the negative logic write control signal WEn. The negative logic write control signal WEn is generated from a write controller 4 based on the writing control signal WEp given from outside and is fed to all the write disturbance protection circuits 33 in common. On receipt of the negative logic write control signal WEn, the write disturbance protection circuits 33 retain all the read bit lines BLRp<0>-BLRp<3> at the same potential as the power supply VDD, for example, 3 V at the time of reading. This operation prevents failed write to non-selected cells.

The read sense amp 34 comprises a differential amplifier. The read sense amp 34 has a non-inverting input terminal connected to the read bit lines BLRp<0>-BLRp<3>. The read sense amp 34 has an inverting input terminal connected to an intermediate potential or a reference power supply VSAREF on a reference power line VSAREFL. The read sense amp 34 amplifies a small voltage difference caused between the plus terminal and the minus terminal to drive the data output terminal DOp<0>-DOp<3> to 0 V or 3 V. The read sense amp 34 may comprise other elements such as an initializing transistor and a latch circuit than the differential amplifier.

The nonvolatile semiconductor memory device thus configured according to the first embodiment selectively drives the write word lines WLWp<0>-WLWp<3>, the read word lines WLRp<0>-WLRp<3>, the write bit lines BLWn<0>-BLWn<3> and the read bit lines BLRp<0>-BLRp<3>. The nonvolatile semiconductor memory device drives the above word lines and bit lines, thereby causing destruction of the insulator in any one of antifuses 12 to change the resistance to store information, or reading out the information.

In other words, in the above configuration, the write word lines WLWp<0>-WLWp<3> are used to select among the memory cells 11 in the row direction on data writing. The read word lines WLRp<0>-WLRp<3> are used to select among the memory cells 11 in the row direction on data reading. The write bit lines BLWn<0>-BLWn<3> are used to write data into the memory cells 11. The read bit lines BLRp<0>-BLRp<3> are used to read data from the memory cells 11.

Figure 2:
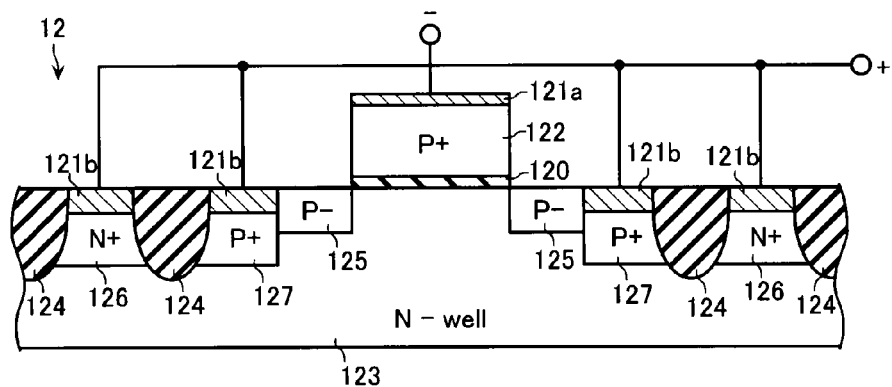
FIG. 2 is a cross-sectional view showing a configuration of an antifuse 12 in the nonvolatile semiconductor memory device according to the first embodiment of the present invention.

Referring next to FIG. 2, a configuration of the antifuse 12 shown in FIG. 1 is described. FIG. 2 is a cross-sectional view showing the configuration of the antifuse 12 according to the first embodiment of the present invention. Hereinafter, the expression "P$^+$" indicates a larger impurity concentration than the expression "P", and the expression "P$^-$" indicates a smaller impurity concentration than the expression "P". Similarly, the expression "N$^+$" indicates a larger impurity concentration than the expression "N".

As shown in FIG. 2, the antifuse 12 includes an insulator 120, a low-potential metal silicide electrode 121a, a high-potential metal silicide electrode 121b, a P$^+$-type polysilicon film 122, an N-type well substrate 123, a device isolation region 124, a P$^-$-type diffused layer 125, an N$^+$-type diffused layer 126, and a P$^+$-type diffused layer 127.

The insulator 120 is formed on the N-type well substrate 123. The insulator 120 is an insulator characteristically destructive with a given voltage. The P+-type polysilicon film 122 is formed on the insulator 120. The low-potential metal silicide electrode 121a is formed on the P+-type polysilicon film 122. The low-potential metal silicide electrode 121a and the high-potential metal silicide electrode 121b are composed of a metal silicide of titanium (Ti), cobalt (Co) or nickel (Ni) and are characteristically molten with current flowing therein. The low-potential metal silicide electrode 121a is supplied with a lower potential than the potential applied to the high-potential metal silicide electrode 121b.

The P−-type diffused layer 125 is formed in the N-type well substrate 123 at both ends of the insulator 120. The P+-type diffused layer 127 is formed outside of the P−-type diffused layer 125. The N+-type diffused layer 126 surrounded by the device isolation region 124 is formed adjacent to the P+-type diffused layer 127. The high-potential metal silicide electrode 121b is formed in the surfaces of the P+-type diffused layer 127 and the N+-type diffused layer 126.

In other words, in the above configuration, the P−-type diffused layer 125 and the P+-type diffused layer 127 are formed in the surface of the N-type well substrate 123. The P−-type diffused layer 125 locates adjacent to the insulator 120 and has a certain impurity concentration. The P+-type diffused layer 127 is provided with the high-potential metal silicide electrode 121b thereon adjacent to the P−-type diffused layer 125 and has a higher impurity concentration than the P−-type diffused layer 125.

Figure 3:
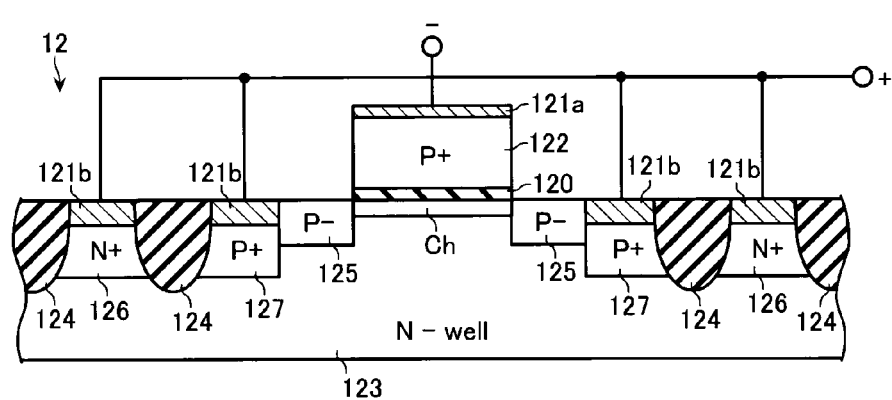
FIG. 3 is a cross-sectional view showing a phase of variations on writing in the antifuse 12 in the nonvolatile semiconductor memory device according to the first embodiment of the present invention.
Figure 4:
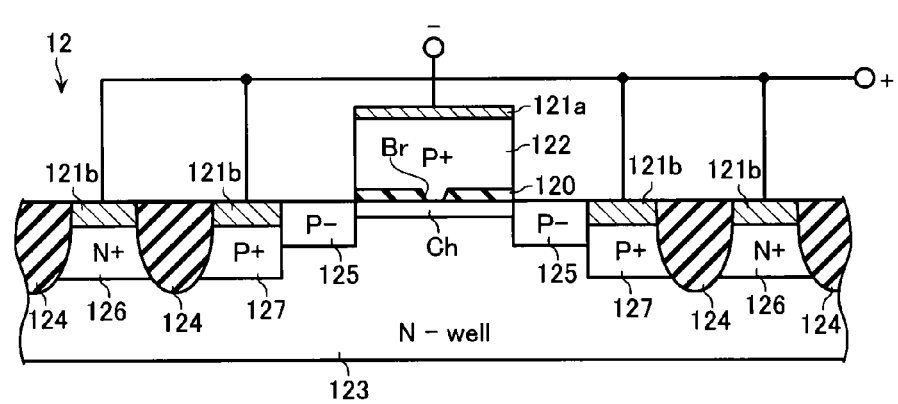
FIG. 4 is a cross-sectional view showing a phase of variations on writing in the antifuse 12 in the nonvolatile semiconductor memory device according to the first embodiment of the present invention.
Figure 5:
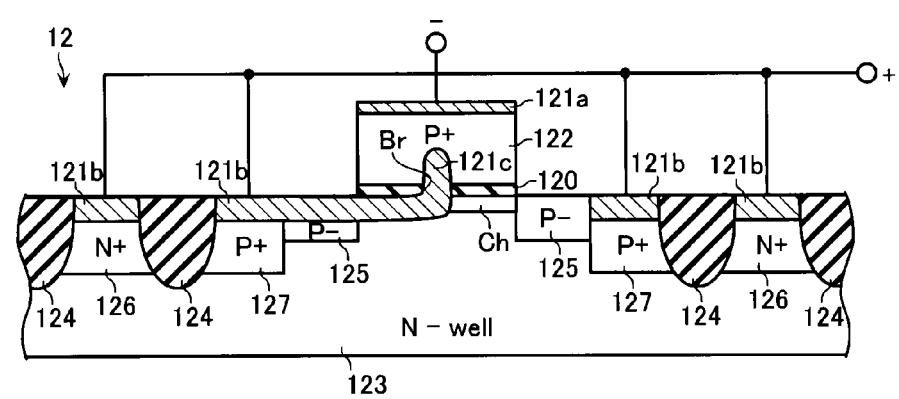
FIG. 5 is a cross-sectional view showing a phase of variations on writing in the antifuse 12 in the nonvolatile semiconductor memory device according to the first embodiment of the present invention.

Referring next to FIGS. 3-5, variations in the antifuse 12 on writing are described. FIGS. 3-5 are cross-sectional views showing phases of variations in the antifuse 12 on writing.

First, a low potential is applied through the low-potential metal silicide electrode 121a to the P+-type polysilicon film 122, and a high potential is applied through the high-potential metal silicide electrode 121b to the P+-type diffused layer 127 and the N+-type diffused layer 126. The voltage difference given at this time is a sufficient voltage to destruct the insulator 120, for example, 6.2 V. Then, a P-type channel Ch is formed in the surface of the N-type well substrate 123 adjacent to the insulator 120 between the P−-type diffused layer portions 125 as shown in FIG. 3. In this case, the N+-type diffused layer 126 serves as a channel stopper capable of suppressing formation of the P-type channel Ch.

Subsequently, after formation of the P-type channel Ch, part of the insulator 120 is destructed to form a breakdown spot Br as shown in FIG. 4.

At the same time on formation of the breakdown spot Br, a current flows through the breakdown spot Br and the current-caused heat melts part of the high-potential metal silicide electrode 121b. The melt turns the element contained in the high-potential metal silicide electrode 121b, for example, titanium (Ti), cobalt (Co) or nickel (Ni) into cations, of which portion is attracted toward the low-potential metal silicide electrode 121a. Then, the cations (metal element) reach the P+-type polysilicon film 122 via the P-type channel Ch and the breakdown spot Br. When the application of the voltage is stopped at this state (to halt the current), the cations (metal element) react again and recombine with surrounding silicon in the P+-type polysilicon film 122 and the N-type well substrate 123 to form a recombined metal silicide 121c as shown in FIG. 5.

In the above state shown in FIG. 5, the high-potential metal silicide electrode 121b is electrically connected to the low-potential metal silicide electrode 121a through the recombined metal silicide 121c and the P+-type polysilicon film 122. In other words, a current path having a lower resistance than the insulator 120 is formed. A sufficiently low voltage incapable of causing destruction of the insulator 120, for example, 1 V maybe applied between the both ends of the insulator 120 (the high-potential metal silicide electrode 121b and the low-potential metal silicide electrode 121a). In this case, a current required for fast reading, for example, 100 μA to 1 mA can flow in the antifuse 12. Therefore, the use of the antifuse 12 in the first embodiment as a memory element makes it possible to provide a nonvolatile semiconductor memory device capable of fast reading.

Second Embodiment

Figure 6:
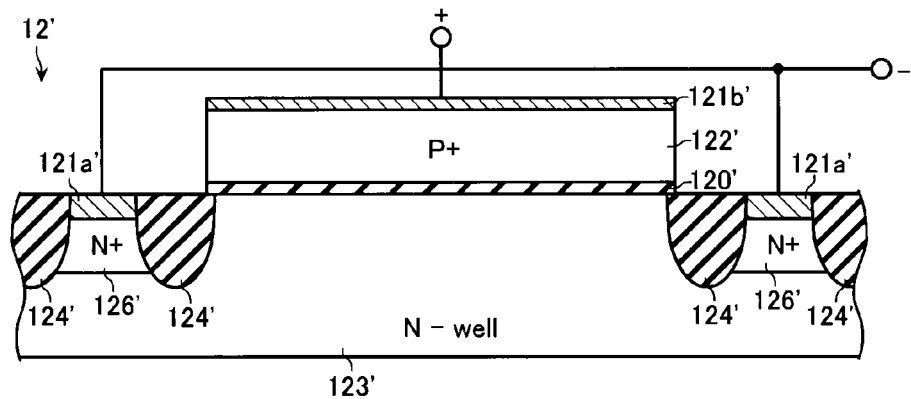
FIG. 6 is a cross-sectional view showing a configuration of an antifuse 12' in a nonvolatile semiconductor memory device according to a second embodiment of the present invention.

Referring next to FIG. 6, a nonvolatile semiconductor memory device according to a second embodiment is described. The nonvolatile semiconductor memory device according to the second embodiment comprises an antifuse 12' in place of the antifuse 12, different from the first embodiment. In a word, the nonvolatile semiconductor memory device according to the second embodiment has the same configuration as the first embodiment shown in FIG. 1 except the configuration of the antifuse 12'.

As shown in FIG. 6, the antifuse 12' according to the second embodiment includes an insulator 120', a low-potential metal silicide electrode 121a', a high-potential metal silicide electrode 121b', a P+-type polysilicon film 122', an N-type well substrate 123', an device isolation region 124', and an N+-type diffused layer 126'.

Like in the first embodiment, the insulator 120' is an insulator characteristically destructive with a given voltage. The low-potential metal silicide electrode 121a' and the high-potential metal silicide electrode 121b' are composed of a metal silicide and are characteristically molten with current flowing therein. The insulator 120' is formed on the N-type well substrate 123'. The P+-type polysilicon film 122' is formed on the insulator 120'. The high-potential metal silicide electrode 121b' is formed on the P+-type polysilicon film 122'. The high-potential metal silicide electrode 121b' is supplied with a higher potential than the potential applied to the low-potential metal silicide electrode 121a'.

The N+-type diffused layer 126' surrounded by the device isolation region 124' is formed in the N-type well substrate 123' at both ends of the insulator 120'. The low-potential metal silicide electrode 121a' is formed in the surface of the N+-type diffused layer 126'. The insulator 120' and the P+-type polysilicon film 122' are formed sufficiently thin such that the metal silicide from the molten high-potential metal silicide electrode 121b' can reach via the P+-type polysilicon film 122'and the insulator 120' to the N-type well substrate 123'.

Figure 7:
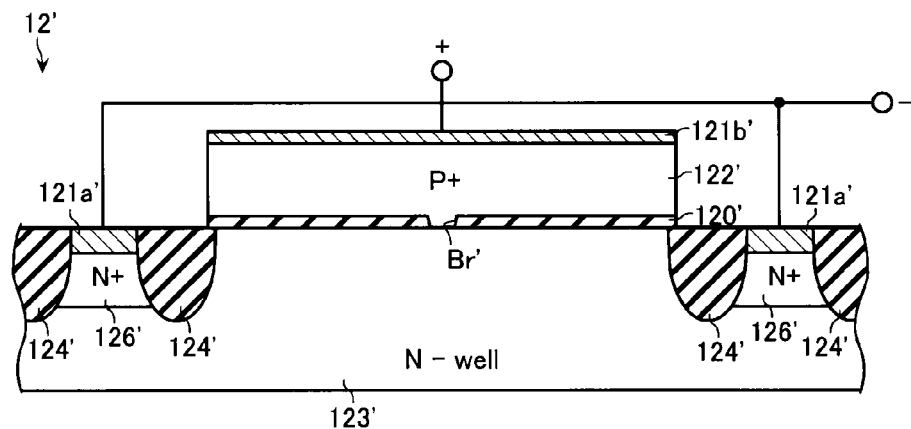
FIG. 7 is a cross-sectional view showing a phase of variations on writing in the antifuse 12' in the nonvolatile semiconductor memory device according to the second embodiment of the present invention.
Figure 8:
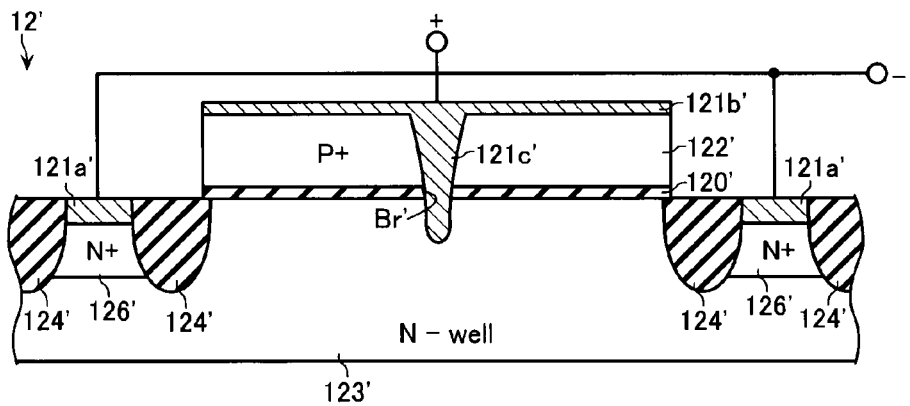
FIG. 8 is a cross-sectional view showing a phase of variations on writing in the antifuse 12' in the nonvolatile semiconductor memory device according to the second embodiment of the present invention.

Referring next to FIGS. 7 and 8, variations in the antifuse 12' on writing are described. FIGS. 7 and 8 are cross-sectional views showing phases of variations in the antifuse 12' on writing.

First, a high potential is applied through the high-potential metal silicide electrode 121b' to the P+-type polysilicon film 122', and a low potential is applied through the low-potential metal silicide electrode 121a' to the N+-type diffused layer 126'. The voltage difference given at this time is a sufficient voltage to destruct the insulator 120', for example, 6.2 V. Then, part of the insulator 120' is destructed to form a breakdown spot Br' as shown in FIG. 7.

At the same time on formation of the breakdown spot Br', a current flows through the breakdown spot Br' and the current-caused heat melts part of the high-potential metal silicide electrode 121b'. The melt turns the element contained in the high-potential metal silicide electrode 121b', for example, titanium (Ti), cobalt (Co) or nickel (Ni) into cations, of which portion is attracted toward the low-potential metal silicide electrode 121a'. Then, the cations (metal element) reach the N-type well substrate 123' via the P+-type polysilicon film 122' and the breakdown spot Br'. When the application of the voltage is stopped at this state (to halt the current), the cations (metal element) react again and recombine with surrounding silicon in the P+-type polysilicon film 122' and the N-type well substrate 123' to form a recombined metal silicide 121c' as shown in FIG. 8.

In the above state shown in FIG. 8, the high-potential metal silicide electrode 121b' is electrically connected to the low-potential metal silicide electrode 121a' through the recombined metal silicide 121c' and the N-type well substrate 123'. In other words, a current path having a lower resistance than the insulator 120' is formed. A sufficiently low voltage incapable of causing destruction of the insulator 120', for example, 1 V maybe applied between the both ends of the insulator 120' (the high-potential metal silicide electrode 121b' and the low-potential metal silicide electrode 121a'). In this case, a current required for fast reading, for example, 100 μA to 1 mA can flow in the antifuse 12'. Therefore, the use of the antifuse 12' in the second embodiment as a memory element makes it possible to provide a nonvolatile semiconductor memory device capable of fast reading.

The embodiments of the invention have been described above though the present invention is not limited to these but rather can be given various modifications, additions, replacements and so forth without departing from the scope and spirit of the invention. For example, in the first and second embodiments, the low-potential metal silicide electrode 121a, 121a' is used in the configuration though an electrode composed of a conductive substance other than the metal silicide may be used in place of the low-potential metal silicide electrode 121a, 121a'. Namely, only the high-potential metal silicide electrode 121b, 121b' given a high potential may be composed of a metal silicide to exert the same effect. In the first embodiment, the antifuse 12 includes the high-potential metal silicide electrode 121b arranged on the top of the N+-type diffused layer 126. It is not required, though, to arrange the high-potential metal silicide electrode 121b in the configuration that applies a high potential to the top of the N+-type diffused layer 126.

What is claimed is:

1. A nonvolatile semiconductor memory device comprising an array of memory cells each including an antifuse to store information based on a variation in resistance in accordance with destruction of the insulator in the antifuse, the antifuse including
    a semiconductor substrate of a first conduction type,
    a first semiconductor layer of a second conduction type formed in the surface of the semiconductor substrate,
    a first electrode provided on the first semiconductor layer to be given a first voltage,
    a second semiconductor layer of the second conduction type provided on the semiconductor substrate with the insulator interposed therebetween,
    a second electrode provided on the second semiconductor conduction layer to be given a second voltage different from the first voltage,
    a first device isolation region provided adjacent to the first semiconductor layer on the semiconductor substrate; and
    a third semiconductor layer of the first conduction type having a higher impurity concentration than the semiconductor substrate and formed in the surface of the semiconductor substrate as surrounded by the first device isolation region, and given a potential equal to that on the first electrode,
    the first electrode or the second electrode being formed of a metal silicide.

2. The nonvolatile semiconductor memory device according to claim 1, wherein the first voltage and the second voltage cause a current, which melts the metal silicide to generate cations, wherein the cations are attracted to a lower potential side via the destructed insulator to form a current path with a lower resistance than the insulator.

3. The nonvolatile semiconductor memory device according to claim 1, wherein both of the first electrode and the second electrode are formed of a metal silicide.

4. The nonvolatile semiconductor memory device according to claim 1, further comprising a third electrode formed on the third semiconductor layer to be given a potential equal to that on the first electrode,
    wherein the third electrode is formed of a metal silicide.

5. The nonvolatile semiconductor memory device according to claim 1, wherein the first semiconductor layer contains
    a first layer located adjacent to the insulator and having a certain impurity concentration, and
    a second layer provided with the first electrode thereon and located adjacent to the first layer and having a higher impurity concentration than the first layer.

6. The nonvolatile semiconductor memory device according to claim 1, wherein the metal silicide includes any one of titanium, cobalt and nickel.

7. A nonvolatile semiconductor memory device comprising an array of memory cells each including an antifuse to store information based on a variation in resistance in accordance with destruction of the insulator in the antifuse, the antifuse including a semiconductor substrate, a first conduction layer formed in the surface of the semiconductor substrate, a first electrode provided on the first conduction layer to be given a first voltage, a second conduction layer provided on the semiconductor substrate with the insulator interposed therebetween, a second electrode provided on the second conduction layer to be given a second voltage different from the first voltage,
    wherein the first electrode or the second electrode is formed of a metal silicide, and
    wherein the memory cells each include a first transistor having one end connected to a first end of antifuse, and a second transistor having one end connected to the first end of the antifuse, wherein the memory cells arearranged plural in grid to configure a memory cell array, further comprising:
    a plurality of write word lines connected to the gate of the first transistor for selecting among the memory cells in the row direction on data writing;
    a plurality of read word lines connected to the gate of the second transistor for selecting among the memory cells in the row direction on data reading;
    a write bit line connected to the other end of the first transistor for writing data in the memory cell;
    a read bit line connected to the other end of the second transistor for reading data from the memory cell;
    a row decoder operative to selectively drive the write word line and the read word line in accordance with an address signal;
    a bit line driver operative to selectively drive the write bit line in accordance with a write signal; and
    a sense amp operative to read data from the read bit line.

8. The nonvolatile semiconductor memory device according to claim 7, further comprising a write disturbance protection circuit operative to charge the read bit line up to a certain voltage on data writing.

9. The nonvolatile semiconductor memory device according to claim 1, further comprising a second device isolation region provided adjacent to the second semiconductor layer on the semiconductor substrate.

* * * * *